United States Patent
Degrenne

(10) Patent No.: US 10,622,281 B2
(45) Date of Patent: Apr. 14, 2020

(54) POWER MODULE AND METHOD FOR MANUFACTURING POWER MODULE

(71) Applicant: MITSUBISHI ELECTRIC CORPORATION, Tokyo (JP)

(72) Inventor: Nicolas Degrenne, Rennes (FR)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/074,713

(22) PCT Filed: Feb. 15, 2017

(86) PCT No.: PCT/JP2017/006445
§ 371 (c)(1),
(2) Date: Aug. 1, 2018

(87) PCT Pub. No.: WO2017/159235
PCT Pub. Date: Sep. 21, 2017

(65) Prior Publication Data
US 2019/0043781 A1    Feb. 7, 2019

(30) Foreign Application Priority Data
Mar. 18, 2016   (EP) .................................... 16161194

(51) Int. Cl.
*H01L 23/42*   (2006.01)
*H01L 23/367*   (2006.01)
*H01L 23/373*   (2006.01)
*H01L 21/48*   (2006.01)

(52) U.S. Cl.
CPC .......... *H01L 23/42* (2013.01); *H01L 21/4882* (2013.01); *H01L 23/3677* (2013.01); *H01L 23/3735* (2013.01)

(58) Field of Classification Search
CPC . H01L 23/42; H01L 23/3677; H01L 23/3735; H01L 21/4882
USPC ........................................................ 257/718
See application file for complete search history.

(56) References Cited

U.S. PATENT DOCUMENTS

| 8,564,114 B1 | 10/2013 | Lanzone |
| 2004/0233642 A1 | 11/2004 | Ito et al. |
| 2015/0369467 A1* | 12/2015 | Saito ..................... H05K 3/305 |
| | | 362/345 |

FOREIGN PATENT DOCUMENTS

| EP | 1 523 040 A2 | 4/2005 |
| EP | 2 849 221 A1 | 3/2015 |
| JP | 9-55459 A | 2/1997 |
| JP | 2014-36033 A | 2/2014 |
| WO | WO 2015/059967 A1 | 4/2015 |

* cited by examiner

*Primary Examiner* — Tong-Ho Kim
(74) *Attorney, Agent, or Firm* — Birch, Stewart, Kolasch & Birch, LLP

(57) ABSTRACT

The present invention concerns a power module comprising a heat sink, a substrate on which a power die is attached, the power module further comprises between the substrate and the heat sink, a first and a second materials, the first material having a thermal conductivity that is higher than the thermal conductivity of the second material, the second material having a first cavity below the power die and the first material is in the first cavity of the second material.

8 Claims, 4 Drawing Sheets

[Fig. 1]
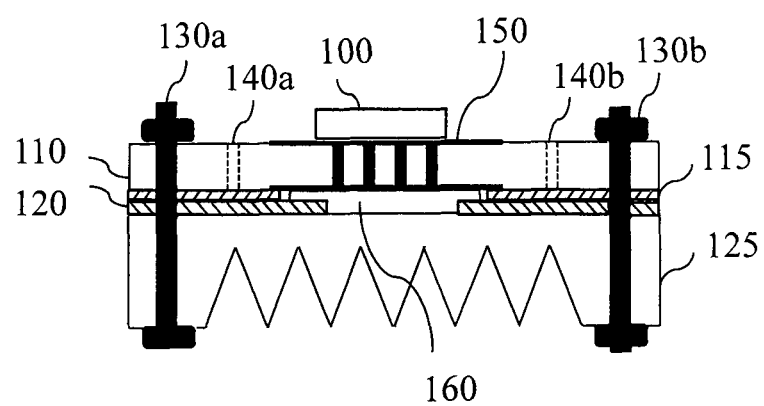
[Fig. 2]
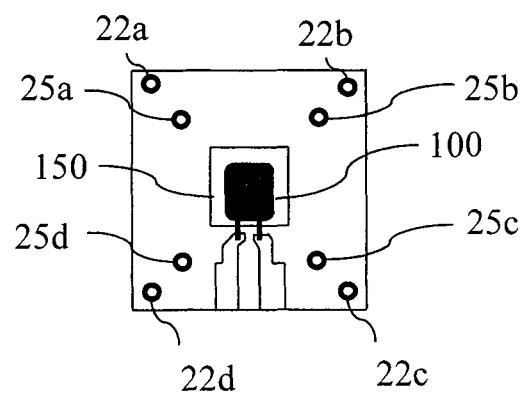

[Fig. 3]
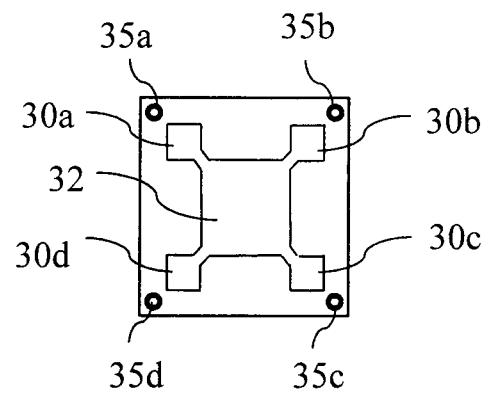
[Fig. 4]
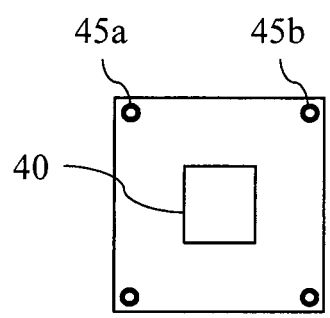

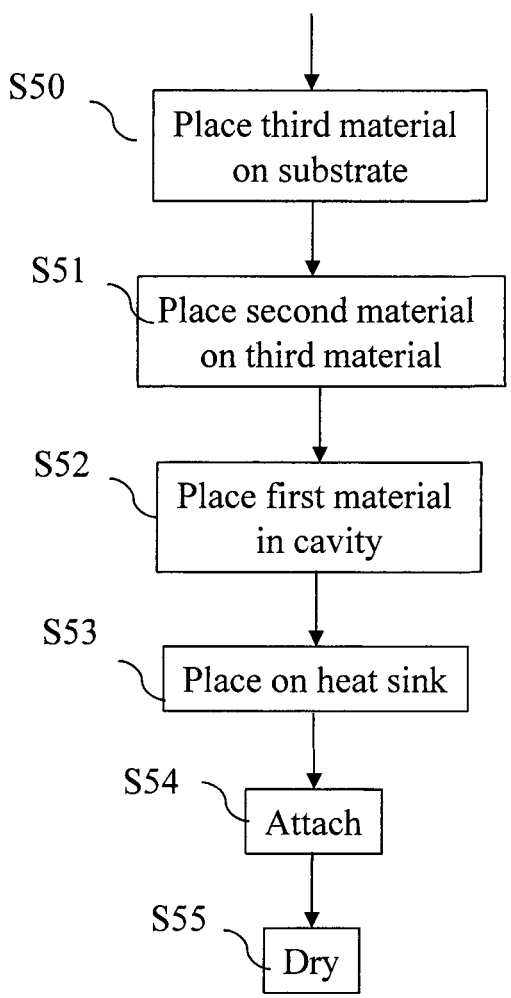
[Fig. 5]

[Fig. 6a]
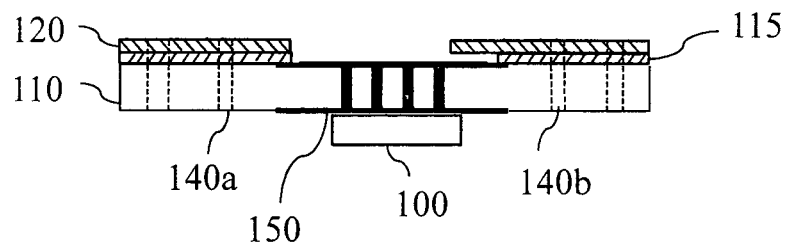
[Fig. 6b]
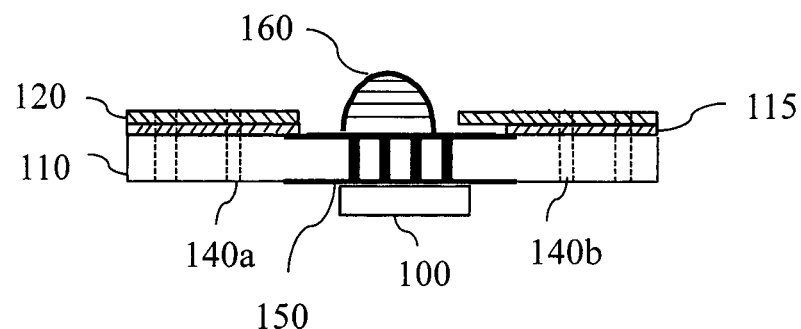
[Fig. 6c]
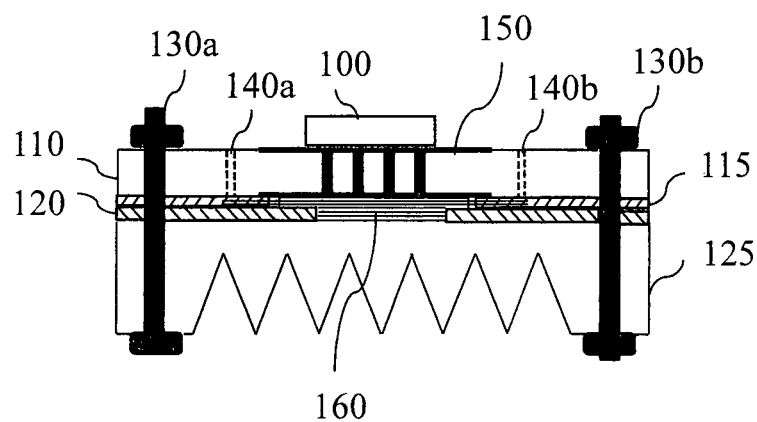

POWER MODULE AND METHOD FOR MANUFACTURING POWER MODULE

TECHNICAL FIELD

The present invention relates generally to a power module comprising a heat sink and a substrate on which a power die is attached.

BACKGROUND ART

Market penetration of wide band gap devices tends to promote low-inductance Surface Mounted Device (SMD) packages where heat extraction is realized through the Printed Circuit Board (PCB). It also tends to promote new packaging technologies where the power semiconductor dies are embedded within the PCB. These two trends allow not only fast switching cell, but also low-cost assembly.

The thermal resistance of the PCB can be sufficiently reduced with thermal vias or thick metal inlays. The main bottleneck is presently on the thermal interface between PCB and heat-sink, that requires: a high conformability to compensate the large irregularities of the PCB and for bending effects due to unequal pressure application and thermo-mechanical strain, a high thermal conductivity to improve the cooling efficiency, an electric isolation between heat-sink and the PCB for security reasons, and finally low material and process costs.

Most thermal interface solutions commercially available today exhibit either low conformability and/or low thermal conductivity like for example FR4 pre-preg, polymide and/or no/low electric isolation like for example thermal grease, graphite pads, and/or high cost like for example isolating pads.

One reason is that present thermal interface materials are designed to provide an interface with a homogeneous and high thermal conduction on the entire surface. This feature is not required anymore in the case of a PCB that is multi-functional by nature, and where heat should be removed at specific locations, more precisely below the power semiconductor die only.

SUMMARY OF INVENTION

The invention aims at providing a highly-conformable, highly thermally conductive, isolating and low-cost interface between a substrate, such as a PCB, and a heat-sink.

To that end, the present invention concerns a power module comprising a heat sink, a substrate on which a power die is attached, characterized in that the power module further comprises between the substrate and the heat sink a first and a second materials, the first material having a thermal conductivity that is higher than the thermal conductivity of the second material, the second material having a first cavity below the power die and the first material is in the first cavity of the second material.

Thus, the power die is cooled through a highly conductive thermal path involving the first material.

According to a particular feature, the substrate comprises thermal vias below the power die.

Thus, the power die is cooled through a highly conductive thermal path involving the first material.

According to a particular feature, the power module further comprises between the substrate and the second material, a third material, the first material having a thermal conductivity that is higher than the thermal conductivity of the third material the third material having a second cavity below the thermal vias and the first material is in the second cavity of the third material, the second cavity being prolongated in at least one direction by at least a third cavity, Thus, the distance between the substrate and the heatsink is adjusted by the thickness of the third material.

In addition, the first material fills entirely the first cavity of the second material. Thus both dielectric isolation and thermal conductivity are guaranteed between the thermal vias and the heatsink.

According to a particular feature, the second cavity of the third material is prolongated in four directions by four cavities.

Thus, the extra quantity of the first material can be evacuated out of the cavity during the manufacturing process, and gas can flow during or after the process.

According to a particular feature, the substrate further comprises four holes, each hole being placed on one cavity that prolongates the second cavity.

Thus, no air is blocked in the first cavity of the second material during the manufacturing process, and both dielectric isolation and thermal conductivity are guaranteed.

According to a particular feature, the first material is a gel and the second and third materials are FR4 pre-preg sheets.

Thus, the first material is very soft, highly conformable, and easily dispensable, and the second and third materials are low-cost, isolating, and ensure a defined distance between the substrate and the heatsink. In addition, the second and the third material can be assembled with a standard PCB process. If the substrate is a PCB, the second and third materials can be assembled to the substrate in the same process step as the substrate.

According to a particular feature, the second and third materials have each 100 µm thickness.

Thus, sufficient isolation is provided both by the second material (100 µm at 40V/µm) and by the first material (200 µm at 16V/µm).

According to a particular feature, the substrate, the second, the third materials and the heat sink are fixed together by nuts and bolts.

The present invention concerns also a method for manufacturing a power module comprising a heat sink, a substrate on which a power die is attached characterized in that the power module further comprises between the substrate and the heat sink, a first and a second materials, the first material having a thermal conductivity that is higher than the thermal conductivity of the second material, the second material having a first cavity below the power die and the first material is in the first cavity of the second material and the method comprises the steps of:

positioning a second material below the substrate or on the heat sink, the second material having a first cavity below the thermal vias, positioning a first material in the first cavity, the first material having a thermal conductivity that is higher than the thermal conductivity of the second material, assembling the substrate, the first, the second materials and the heat sink in order to form the power module.

According to a particular feature, the method comprises further step, executed prior to the placing of the first material, of:

positioning a third material on the second material, the first material having a thermal conductivity that is higher than the thermal conductivity of the third material, the third material having a second cavity below the thermal vias and the first material is in the second cavity of the third material, the second cavity being prolongated in at least one direction by at least a third cavity, and the first material is placed in the second cavity.

Thus, the first material can be dispensed in the entire first cavity with a simple low-cost and reliable process.

BRIEF DESCRIPTION OF DRAWINGS

The characteristics of the invention will emerge more clearly from a reading of the following description of an example of embodiment, the said description being produced with reference to the accompanying drawings, among which:

FIG. 1 is a diagram representing a first example of a section of a power module that uses a thermal interface assembly according to the invention;

FIG. 2 is a diagram representing the substrate of the power module on which a power die is disposed;

FIG. 3 represents the shape of a spacer of the thermal assembly according to the present invention;

FIG. 4 represents the shape of an isolator sheet according to the present invention;

FIG. 5 represents an algorithm for assembling a thermal interface according to the present invention;

FIG. 6a represents one of different phases of the assembly of the thermal interface according to the present invention;

FIG. 6b represents one of different phases of the assembly of the thermal interface according to the present invention;

FIG. 6c represents one of different phases of the assembly of the thermal interface according to the present invention.

DESCRIPTION OF EMBODIMENTS

FIG. 1 is a diagram representing a first example of a section of a power module that uses a thermal interface assembly according to the invention.

The power module comprises a substrate 110 on which a power die 100 is attached (e.g. soldering). The substrate 110 is composed of two layers and thermal vias 150 that are filled with a thermally conductive material and capped so that solder does not flow through the via. Alternatively, copper inlay can be used.

In a variant, the power die 100 may be embedded in the substrate in the place of the thermal vias.

The substrate 110 may be also a multi-layer PCB wherein internal copper planes can be used to spread the heat towards the heat-sink 125. The substrate may contain some holes or un-filled vias 140a and 140b to allow gas circulation and gel drying/curing.

The power die 100 is a MOSFET, or an IGBT or a diode, in a SMD package such as DPak or D2Pak. Alternatively, the power die is embedded within the PCB.

The FIG. 1 shows a single power die, the present invention is also applicable when plural power dies are soldered on the substrate 110.

According to the invention, between the substrate 110 and the heat sink 125, at least two materials types are disposed. A first material 160 is highly conformable and can absorb thickness variations of several tens of µm, highly thermally conductive, for example more than 1 W/(m·K) and electrically isolating, for example more than 10 kV per mm. The second material 120 is electrically isolating, for example more than 10 kV per mm and low-cost and its thermal conductivity is lower than the thermal conductivity of the first material, for example less than 0.5 W/(m·K).

The first material 160 is typically used below the power die 100 where both electrical isolation and thermal conductivity are required and the second material 120 is typically used at locations where only electrical isolation is required.

For example, the first material 160 is a thermally conductive liquid gap filling material, so-called gel, curable or non-curable, and the second material 120 is a FR4 pre-preg sheet with a thickness of 100 µm, so-called isolator. A third material 115 is disposed between the second material 120 and the substrate 110.

For example, the third material is a FR4 pre-preg sheet with a thickness of 100 µm so-called spacer.

The third material and the second material sheets cover the majority of the surface between the substrate 110 and the heat-sink 125.

Below the power semiconductor die 100, the thermally conductive gel 160 is used to provide a highly efficient thermal path.

The substrate 110, the second and third materials and the heat-sink are assembled together using several screws or nuts and bolts 130a and 130b. The screws 130a and 130b can either cross the substrate 110, the second and third materials and the heat-sink or can be inserted to the heat-sink and only going across the substrate 110, the second and third materials. Alternatively, a spring or another mechanical means can be used.

FIG. 2 is a diagram representing the substrate of the power module on which a power die is disposed.

As already disclosed, the substrate 110 is composed of two layers and thermal vias 150 that are filled with a thermally conductive material and capped so that solder does not flow through the via. The power die 100 is soldered on the vias 150. The substrate 110 has four holes 22a to 22d for the screws 130.

According to a particular feature of the present invention, the substrate 110 comprises four holes 25a to 25d that are disposed, when the power module is assembled, on the top of cavities provided by the third material 115.

FIG. 3 represents the shape of a spacer of the thermal assembly according to the present invention.

The third material 115 or in other words, the spacer, is for example a 100 µm FR4 sheet. The part of the third material that is below the thermal vias 150 is a cavity 32 that is prolongated in at least one direction by at least another cavity. In the example of FIG. 3, the part of the third material that is below the thermal vias 150 is a cavity 32 that is prolongated in four directions by four cavities noted 30a to 30d.

The other cavities 30a and 30d enable, during the assembly of the power module, that an excess of the first material is evacuated through these cavities.

The other cavities, or dispensing, can be realized according to several patterns, optimized to prevent air presence in the gel. Some through-holes in the substrate 110 and/or heat-sink can also be used to dispense the gel once the power module is mechanically assembled with the heat-sink 125.

The third material 115 has four holes 35a to 35d for the screws 130.

The third material 115 provides, together with the second material 120, a 200 µm gel thickness, to make sure that the isolation is sufficient at the boundary between gel and isolator, and to absorb extra gel.

FIG. 4 represents the shape of an isolator sheet according to the present invention.

The second material or in other words the isolator sheet 120 is for example a 100 µm FR4 sheet. The part of the second material that is below the thermal vias 150 is a cavity 40.

The second material 120 has four holes 45a to 45d for the screws 130.

For example, the thickness of the isolator 120 is defined to withstand at least the required isolation voltage, like for example 3 kV. In the case of FR4 material, thickness of 100 µm is selected.

FIG. 5 represents an algorithm for assembling a thermal interface according to the present invention.

At step S50, the third material 115 is positioned on the substrate 110.

At step S51, the second material is positioned on the third material as shown in FIG. 6a.

FIG. 6a shows the positioning of the third and second materials on the substrate.

At step S52, a precise amount of first material 160 is placed in the cavity formed by the second and third materials 120 and 115.

The thickness of the gel is defined to at least withstand the required isolation voltage. For example, in the case of a commercially available gel "Bergquist GF1500" (16 kV/mm), a 187.5 µm thickness is required. A thickness of 200 µm is selected.

The quantity of gel is calculated to ensure the isolation is performed in the cavity, and taking into account substrate 110 bending and the various uncertainties that can apply. As such, more gel is generally dispensed than required without degrading the behaviour of the power module thanks to the other cavities 35a to 35d of the third material 115. Automatic dispenser can be used.

The first material may well be a gel that cures as discussed above, or a gel that stays viscous with time, or a gel which viscosity changes with applied temperature or a Pad with high softness, or a combination of materials of different nature that provides a highly conformable, electrically isolating, and thermally conductive material.

FIG. 6b shows the positioning of the first material in the cavity formed by the second and third materials 120 and 115.

At step S53, the heat sink is positioned on the assembly obtained at step S52.

At step S54, the assembly screws 130 are pressed at a predetermined torque, for example e.g. 0.2 N/m. Note that during this step, the gel is spread in the cavity and ensures a good conformability between the heat sink 125 and the substrate 110.

At step S54, the gel may be dried at ambient temperature or at a higher curing temperature. It has to be noted here that step S54 is optional.

It has to be noted here that the second and third materials may well be adhesive materials that are pre-assembled to the substrate 110, or to the heat-sink 125. It can be, for example, FR4 or polyimide.

Naturally, many modifications can be made to the embodiments of the invention described above without departing from the scope of the present invention.

The invention claimed is:

1. A power module comprising
   a heat sink,
   a power die,
   a substrate on which the power die is attached wherein the power module further comprises between the substrate and the heat sink,
   a first material and a second material, the first material having a thermal conductivity that is higher than the thermal conductivity of the second material, the second material having a first cavity below the power die and the first material is in the first cavity of the second material,
   wherein the second material is connected to the heat sink via at least one of a screw, nut and bolt, spring, or other mechanical device.

2. The power module according to claim 1, wherein the substrate comprises thermal vias below the power die.

3. A power module comprising a heat sink, a substrate on which a power die is attached wherein the power module further comprises between the substrate and the heat sink, a first material and a second material, the first material having a thermal conductivity that is higher than the thermal conductivity of the second material, the second material having a first cavity below the power die and the first material is in the first cavity of the second material,
   wherein the power module further comprises between the substrate and the second material, a third material, the first material having a thermal conductivity that is higher than the thermal conductivity of the third material, the third material having a second cavity below the thermal vias and the first material is in the second cavity of the third material, the second cavity being prolongated in at least one direction by at least a third cavity.

4. The power module according to claim 3, wherein the second cavity of the third material is prolongated in four directions by four cavities.

5. The power module according to claim 4, wherein the substrate further comprises four holes, each hole being placed on one cavity that prolongates the second cavity.

6. The power module according to claim 3, the first material is a gel and the second and third materials are FR4 pre-preg sheets.

7. The power module according to claim 6, wherein the second and third materials have each 100 µm thickness.

8. The power module according to claim 3, wherein the substrate, the second, the third materials and the heat sink are fixed together by nuts and bolts.

* * * * *